United States Patent
Bobrov et al.

(10) Patent No.: US 10,373,795 B2
(45) Date of Patent: Aug. 6, 2019

(54) INTEGRATED CIRCUIT ANALYSIS SYSTEMS AND METHODS WITH LOCALIZED EVACUATED VOLUME FOR E-BEAM OPERATION

(71) Applicant: FEI Company, Hillsboro, OR (US)

(72) Inventors: Yakov Bobrov, Burlingame, CA (US); Cecelia Anne Campochiaro, Sunnyvale, CA (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/849,389

(22) Filed: Dec. 20, 2017

(65) Prior Publication Data
US 2018/0197713 A1    Jul. 12, 2018

Related U.S. Application Data

(60) Provisional application No. 62/437,046, filed on Dec. 20, 2016.

(51) Int. Cl.
*H01J 37/18* (2006.01)
*H01J 37/28* (2006.01)
(Continued)

(52) U.S. Cl.
CPC .............. *H01J 37/18* (2013.01); *H01J 37/20* (2013.01); *H01J 37/244* (2013.01); *H01J 37/28* (2013.01);
(Continued)

(58) Field of Classification Search
CPC .. H01J 37/18; H01J 37/20; H01J 37/28; H01J 37/244; H01J 2237/2006; H01J 2237/2448; H01J 2237/24564
(Continued)

(56) References Cited

U.S. PATENT DOCUMENTS

| | | |
|---|---|---|
| 4,241,259 A | 12/1980 | Feuerbaum et al. |
| 4,584,479 A | 4/1986 | Lamattina et al. |

(Continued)

FOREIGN PATENT DOCUMENTS

WO    2007143734 A2    12/2007

OTHER PUBLICATIONS

Cameron, R.E. et al., "Minimizing Sample Evaporation in the Environmental Scanning Electron Microscope," Journal of Microscopy, Mar. 1994, pp. 227-237, vol. 173, Part 3.
(Continued)

*Primary Examiner* — Nicole M Ippolito

(57) ABSTRACT

Provided are new techniques for fault analysis in IC semiconductor devices, including system designs and methods to enable the probing of circuitry within an IC device under test (DUT) using electron beam (e-beam) techniques while the DUT is being stimulated electrically, or while the device is active on its own or within a host system mounted in a circuit board or other module. The DUT could be a packaged IC, or an IC in some unpackaged form. To create a local evacuated volume immediately outside the e-beam tool, a sealing element is sealed against or around the DUT for a localized seal. Such an arrangement obviates the need for vacuum feedthroughs of possibly thousands of signals required to operate and monitor the DUT, and further enables probing of a DUT while it is operating in its normal environment, such as installed on a circuit board in its system, or on a tester.

21 Claims, 6 Drawing Sheets

(51) Int. Cl.
*H01J 37/20* (2006.01)
*H01J 37/244* (2006.01)

(52) U.S. Cl.
CPC . *H01J 2237/0245* (2013.01); *H01J 2237/162* (2013.01); *H01J 2237/2006* (2013.01); *H01J 2237/2448* (2013.01); *H01J 2237/24564* (2013.01)

(58) Field of Classification Search
USPC .................. 250/306, 307, 309, 310, 311
See application file for complete search history.

(56) References Cited

U.S. PATENT DOCUMENTS

| | | |
|---|---|---|
| 4,607,167 A | 8/1986 | Petric |
| 4,706,019 A | 11/1987 | Richardson |
| 4,818,838 A | 4/1989 | Young et al. |
| 5,103,102 A | 4/1992 | Economou et al. |
| 5,453,617 A | 9/1995 | Tsuneta et al. |
| 5,638,005 A | 6/1997 | Rajan et al. |
| 5,972,725 A | 10/1999 | Wollesen et al. |
| 6,421,122 B2 | 7/2002 | Nara et al. |
| 6,667,475 B1 | 12/2003 | Parran et al. |
| 6,710,354 B1 | 3/2004 | Koch et al. |
| 6,768,114 B2 | 7/2004 | Takagi |
| 6,831,278 B2 | 12/2004 | Yamamoto et al. |
| 6,853,941 B2 | 2/2005 | Wang et al. |
| 6,872,581 B2 | 3/2005 | Shaw et al. |
| 7,043,848 B2 | 5/2006 | Hollman et al. |
| 7,211,797 B2 | 5/2007 | Nishiyama et al. |
| 7,220,963 B2 | 5/2007 | Gross |
| 7,220,973 B2 | 5/2007 | Yu et al. |
| 7,294,833 B2 | 11/2007 | Konno et al. |
| 7,456,413 B2 | 11/2008 | Buijsse et al. |
| 2002/0024012 A1 | 2/2002 | Abe et al. |
| 2006/0231773 A1* | 10/2006 | Katagiri ................ H01J 41/12 250/492.1 |
| 2009/0200489 A1 | 8/2009 | Tappel et al. |

OTHER PUBLICATIONS

Mathieu, C., "The Beam-Gas and Signal-Gas Interactions in the Variable Pressure Scanning Electron Microscope," Scanning Microscopy, 1999, pp. 23-41, vol. 13, No. 1.

Toth, M. et al., "On the Role of Electron-Ion Recombination in Low Vacuum Scanning Electron Microscopy," Journal of Microscopy, Jan. 2002, pp. 86-95, vol. 205, Part 1.

* cited by examiner

INTEGRATED CIRCUIT ANALYSIS SYSTEMS AND METHODS WITH LOCALIZED EVACUATED VOLUME FOR E-BEAM OPERATION

BACKGROUND OF THE INVENTION:

1. Field of the Invention

This invention relates to integrated circuit (IC) diagnosis, characterization and modification using charged particle beams.

2. Background

Electrical Failure Analysis isolates electrical issues in complete IC devices running under test (DUT). Shrinking nodes, new materials, and more complex structures are driving new isolation technologies and improvement of system resolution to detect the faults.

Electron beam diagnostic systems are a powerful tool used for IC characterization and debugging applications. Electron beam diagnostic systems are used, for example, for secondary electron imaging, circuit navigation using a built-in computer automated design (CAD) display, and voltage measurements from active circuits using voltage contrast principles. (See, for example, U.S. Pat. No. 4,706,019.) Other electron beams diagnostic systems use the electrons in the beam to affect a signal to detect faults. Such systems include Electron Beam-Induced Current (EBIC), Resistive Contrast Imaging (RCI), biased RCI (BRCI), Charge-Induced Voltage Alteration (CIVA), Low Energy CIVA (LE-CIVA), Electron-Beam Absorbed Current (EBAC), and Electron Beam-Induced Resistance Change (EBIRCH).

U.S. Pat. No. 6,872,581 to Shaw, et al., teaches methods for IC diagnosis, characterization, or modification using a charged particle beam. In one implementation, the bulk silicon substrate of an IC is thinned from the back side to about 1 to 3 μm from the deepest well, and a voltage is applied to a circuit element that is beneath the surface of the thinned substrate. The applied voltage induces an electrical potential on the surface, which is detected by the interaction of the induced voltage with the charged particle beam. U.S. Pat. No. 5,972,725 to Wollesen, et al., similarly enables back-side voltage measurement by removing a portion of the silicon substrate using a combination of mechanical polishing and plasma etching, providing a supply voltage to the circuit, and observing the voltage contrast in the electron beam image.

It is desirable for such examination techniques to activate the IC circuitry with test signals design to operate the IC in test conditions. Activating modern ICs inside an SEM chamber requires hundreds to thousands of high-speed electrical feedthroughs, and this is a challenge. The number of high-speed feedthroughs required generally increases as the size (transistor count) and complexity of circuits generally accompanies an increased count in input output (I/O) terminals on the device. Historical e-beam solutions all relied on electrical signals being "passed through" into a vacuum chamber of the SEM, which is a cumbersome and slow process that may require specialized connection equipment to be produced for a particular IC.

SUMMARY OF THE INVENTION

An object of the invention is to provide a method and apparatus for IC analysis using an SEM.

A method of examining an IC using a scanning electron microscope (SEM) having an SEM column with an SEM column opening at one end from which an electron beam is emitted. The method may include sealing the SEM column opening around a target area on the IC back-side to create a sealed volume at the SEM column opening, the target area forming a part of the enclosure of the sealed volume; evacuating the sealed volume; applying a voltage to a circuit element of the IC, the voltage inducing an electrical potential in the target area; and scanning the electron beam over the target area to detect the electrical potential at the surface of the target area.

An apparatus may include a test fixture including multiple electrical probes to connect to multiple contacts on the IC; an SEM including an electron source, a focusing column having a distal end from which an electron beam is emitted toward the target area, and an electron detector positioned to detect electrons emitted from the target area in response to the incident electron beam; a sealing element adapted to be positioned at the distal end of the SEM focusing column and having a central opening to allow electrons to pass; a moveable mount holding the SEM or the IC and configured to cause relative motion between the SEM and the IC to cause the sealing element to form a seal between the SEM focusing column and the IC or the test fixture, the seal around the target area; and a vacuum pump coupled to the SEM focusing column and operable to create the partial vacuum between the IC and the distal end of the vacuum column.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF EXAMPLE EMBODIMENTS

Figure 1:
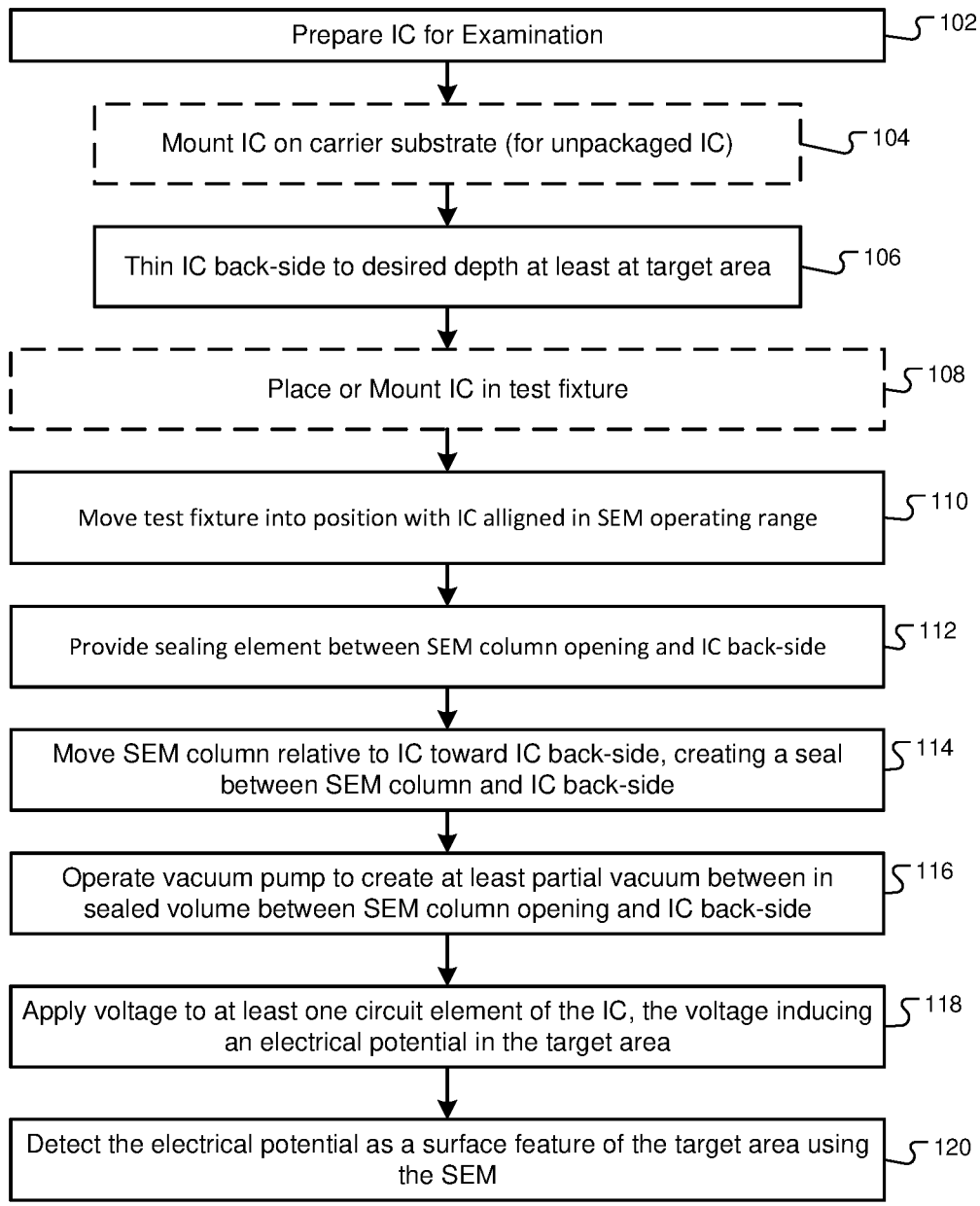
FIG. 1 is a flowchart of a process for examining IC's according to some embodiments.

A new approach for fault analysis in IC semiconductor devices is described. System designs and methods are provided to enable the probing of transistors, their dopant wells, and their ancillary connections contained within an IC device under test (DUT) using electron beam (e-beam) techniques while the DUT is being stimulated electrically, either by an Automated Test Equipment (ATE) tester, or while the device is active on its own or within a host system mounted in a circuit board or other module. The DUT could be a packaged IC, or it could reside in unpackaged form, including as part of a complete manufacturing wafer. Existing e-beam probing systems such systems have required that the DUT be placed in a high-vacuum environment. The designs and methods herein seek to avoid the need of placing the DUT within a high vacuum, and instead use an Environmental Scanning Electron Microscope (ESEM) or a low-vacuum SEM where the DUT can be in a relatively low ("poor")-vacuum environment. The SEM column is sealed against and/or around the DUT with a localized seal for creating a local evacuated volume. The low-vacuum in the ESEM/DUT local evacuated volume may be maintained with a small pumping port in the chamber constructed around the SEM column, or by pumping through a small ESEM aperture from the column-side of the ESEM/DUT chamber. Such an arrangement obviates the need for vacuum feedthroughs of possibly thousands of signals required to operate and monitor the DUT, and further enables probing of a DUT while it is operating in its normal environment, such as installed on a circuit board in its system, or on an ATE tester. The pressure in the DUT environment is typically between about 10 Pa and 25 kPa. An ESEM uses gas cascade amplification secondary electron detection. In some applications, an SEM with a low vacuum level can use a back-scattered electron detector. The pressure at the DUT should be within a range that the detector will provide a useful signal. The upper limit of the pressure is also determined by the ability of the column vacuum pump to maintain a sufficient vacuum at the electron source and in the optical column to provide an electron beam with sufficient resolution at the DUT. The SEM column will typically have a pressure limiting aperture to maintain a lower pressure at the electron source and throughout most of the focusing column to avoid contamination of the source and dispersal of the beam through most of the column. The pressure after the pressure limiting aperture, where the column seals against the DUT or test fixture, can be greater that the pressure above the pressure limiting aperture.

The various aspects provide the benefits of greatly simplifying the test setup for examining an IC with an SEM. The benefits of improved speed and cost both in equipment costs in connecting signals to the IC (which would otherwise typically need a vacuum chamber with electrical passthroughs), and labor time and cost in setting up the connections to the IC DUT. Time is saved by pumping a much smaller volume of vacuum to inspect an IC, and time is saved through allowing a lower quality vacuum (at least a partial vacuum) in the small vacuum volume created at the end of the SEM column sealed to the DUT or test fixture. Improved access to the IC is provided to move other test tools into position to examine the IC DUT, allowing test procedures to be designed which may switch tools more frequently than previous procedures. Versions that employ a column adapter element also improve the inter-operability of equipment and allow more value to be realized from existing SEM equipment in performing the new features herein. Many other advantages may also be realized from various features used in combination herein.

In one embodiment, a simple O-ring sealing element is sufficient to seal off a portion of the DUT such that outside the O-ring seal ambient atmospheric conditions are allowed to exist, and within the seal a vacuum of sufficient level is maintained to allow SEM operation. As used herein, "sealed to the DUT" also includes sealed to a fixture or module holding the DUT. This arrangement prevents the entire DUT, and possibly ATE as well, from needing to be at vacuum within a high-vacuum SEM chamber. The SEM may be placed on mechanical stages such that either e-beam probing, standard optical probing, thermal emission, or any other electrical fault analysis tool could be moved into place at the DUT position.

One aspect of the system described herein includes the provision of a sealing element to provide a localized seal between the distal end of the SEM column and a target region on the backside of the IC to create at least a localized enclosed volume which can be evacuated to create a partial vacuum for operating an SEM of some type. Another aspect being the operation of an SEM in an at least partial vacuum created in a localized volume surrounding a target area of the DUT, allowing electrical connections to be made to the DUT outside of a vacuum to avoid running the electrical connections into a vacuum chamber. These techniques are preferably employed with a thinned IC DUT.

Another embodiment provides a method of examining an IC including thinning a back-side of the IC at least at a target area to be examined, and placing the IC in a test fixture if the IC is not already mounted in a circuit module that serves as a test fixture. The circuit module, test fixture, or other device for holding the IC is referred to as a "IC holder" or "circuit holder." The method then includes moving an (SEM column relative to the IC into a position near the target area at the IC back-side. Either the SEM or the IC may be moved to accomplish the relative movement. The method creates a seal between the SEM column opening and the IC back-side, the seal surrounding the target area. Then the method creates at least a partial vacuum in a sealed volume between the SEM column opening and the IC back-side surface. At least one voltage is applied to a circuit element of the IC, the voltage inducing an electrical potential in the target area. The method then detects the electrical potential as a surface feature of the target area using the SEM.

Many features and techniques may be used in any suitable sub-combination with the method. The seal may form an opening between the SEM column and the target area. The seal may be created with an O-ring. It may also be created with a sealing element positioned at a distal end of the SEM column. Creating the seal may include moving the SEM column toward the IC to compress a sealing element against the IC. Moving the SEM column relative to the IC may be performed by moving a motion stage on which the SEM is mounted. The at least partial vacuum may comprise a pressure of 1 kPa or greater in some versions. Higher vacuum levels (lower pressures) may be used where achievable, with higher vacuum levels being preferred generally for higher quality SEM data. The vacuum level achievable depends on the leakage through the seal and on the vacuum pump. The method may further include detecting photons emitted from the IC inside the sealed volume while scanning the SEM. The SEM column may be an environmental SEM (ESEM) column. The SEM column may be a low-vacuum SEM column. The method may include moving a near-infrared (NIR) microscope or another suitable inspection tool into a position adjacent the target area and examining the IC with the other tool. The method may further include obtaining a surface voltage contrast image by detecting the electrical potential of multiple features along the target area. This may include using a voltage contrast image for locating a circuit element in the IC for examination with the SEM. It may also include using the voltage contrast image for detecting a fault in a circuit element in the IC. The method may include using other electron beam analysis techniques, such as EBIC, RCI, BRCI, CIVA, LECIVA, EB AC, and EBIRCH.

Thinning the IC back-side may include thinning to a sub-micron thickness from the circuit elements closest to the IC back-side in the target area. Thinning the IC back-side may include thinning the back side to a distance of less than 50 nanometers from circuit elements closest to an IC back surface in the target area. Thinning the IC back-side may include exposing circuit elements of the IC in the target area. The SEM column may have a column adapter element mounted at a column opening to narrow the column opening. Such a column adapter element may be constructed to narrow the column opening to a diameter to a diameter suitable to examine a particular IC, such as a diameter of less than 5 mm, or a diameter of less than 2 mm. The seal may be created by a sealing element, the sealing element positioned on a distal side of the column adapter element. The method may include cooling the IC while applying the voltage to the circuit element in the IC by extracting heat from the IC back-side outside of the sealed volume. The test fixture may be a probe card. The method further including applying time varying voltages to the IC through terminals in the IC through a probe card, or through a circuit board or other circuit module in which the IC is mounted and electrically connected. The IC may in packaged form, or in unpackaged or partially packaged form. Detecting the electrical potential as a surface feature of the target area may further include detecting time variation of the electrical potential. The method may further include providing multiple high-speed time-varying electrical signals for connecting to and testing the IC, and connecting said multiple signals to the test fixture.

According to another aspect, an apparatus is provided for examining an IC. The apparatus includes a test fixture having a connector or footprint adapted to receive the IC and electrically connect to multiple contacts on the IC. The test fixture may include a circuit board or module provided with the IC already mounted for inspection. The apparatus includes an SEM including an electron source, a focusing column having a distal end for emitting an electron beam toward a target area, and an electron detector positioned to detect electrons from the target area. A sealing element having a central opening and adapted to be positioned at the distal end of the SEM column to allow electrons to pass through the central opening. One or more mounting structures are provided, holding the SEM and the test fixture, at least one of the mounting structures adjustable to a first inactive position in which the test fixture holds the IC spaced apart from the sealing element and SEM column, and a second operational position in which the test fixture holds the IC with the back-side of the IC placed against the sealing element to form a seal between the IC back-side and the SEM column distal end, creating a sealed volume which can be evacuated to at least a partial vacuum. A vacuum pump is coupled to the SEM focusing column and operable to create the partial vacuum.

Many other features may be provided in any suitable sub-combination with the apparatus. The apparatus may further include a controller operatively connected to the SEM, and programmed to control the SEM to perform voltage contrast imaging on a thinned target area on the back-side of the IC. The test fixture socket includes multiple electrical connections for coupling multiple high speed electrical signals to and from the IC, the electrical connections coupled to the IC outside of the sealed volume. The mounting structures may include an x,y,z movable platform on which the SEM is mounted. The apparatus may further include at least one additional inspection tool held by at least one of the one or more mounting structures, which may move a tool into place to observe the IC, where the inspection tool is one of a near-infrared microscope, a laser-assisted device alteration (LADA) device, a visible light probe, a visible light microscope, or a photon emission microscope (PEM). The sealing element may be a deformable gasket and in which creating the seal includes moving the SEM focusing column toward the IC to compress the sealing element against the IC back-side. The sealing element may be mounted to the SEM focusing column distal end. The SEM column may have a column adapter element mounted at the column opening. The sealing element may be mounted to such a column adapter element. A column adapter element may be adapted to hold the sealing element, with the sealing element being removable and interchangeable. A column adapter element may be included which narrows the column opening. This may be done to a diameter of less than 2 mm, or less than 5 mm, for example.

Another embodiment provides a method of examining an IC is provided. The method includes thinning a back-side of the IC at a target area to be examined. If the IC is not already mounted in a circuit module that serves as a test fixture, the method will place the IC in a test fixture and electrically connecting the test fixture to circuit elements in the IC. The method moves an SEM column relative to the IC into a position near the target area at the IC back-side. It then creates a seal between the SEM column opening and the IC back-side, the seal surrounding the target area, and creates at least a partial vacuum in a sealed volume between the SEM column opening and the IC back-side. The method applies multiple time varying voltage signals from the test fixture to selected IC circuit elements to create test conditions in the IC, the signals inducing at least one-time varying electrical potential in the target area. It detects the at least one time varying electrical potential as a surface feature of the target area using the SEM.

Many features and techniques may be used in any suitable sub-combination with the method. The IC may be mounted to a carrier substrate, the carrier substrate electrically connecting circuit elements of the IC to external electrical terminals, and placing the IC in a test fixture may include electrically connecting the test fixture to the IC circuit elements through the external electrical terminals. The IC may be a packaged IC, with the method further including removing at least part of a packaging layer covering the back-side of the IC before thinning the back-side of the IC at the target area. Thinning the back-side of the IC may include thinning the entire back side of the IC. Thinning the back-side of the IC may include exposing circuit elements of the IC in the target area. A thin layer such as a sub-micron layer may be left over the circuit elements. The method may include moving the SEM column relative to the IC away from the target area and moving an additional inspection tool into position to examine the target area, the additional inspection tool being one of a near-infrared microscope, a laser-assisted device alteration (LADA) device, a visible light probe, a visible light microscope, or a photon emission microscope (PEM). The method may further include, after inspecting the IC with the additional inspection tool, moving the additional inspection tool away from the IC, and repeating the following: moving an SEM column relative to the IC into a position near the target area at the IC back-side; creating a seal between the SEM column opening and the IC back-side, the seal surrounding the target area; creating at least a partial vacuum in a sealed volume between the SEM column opening and the IC back-side surface; applying multiple time varying voltage signals to selected IC circuit elements to create test conditions in the IC, the signals inducing a time varying electrical potential in the target area; and detecting the time varying electrical potential as a surface feature of the target area using the SEM.

Other embodiments are possible based on the description herein. For example, a column adapter element can be constructed to be placed on an SEM column, and to include or hold a sealing element for sealing against or around an IC chip to create a localized evacuated volume for examining the IC with an SEM. Other embodiments may include an SEM having a column distal tip configured to hold a sealing element for sealing against or around an IC chip to create a localized evacuated volume for examining the IC with the SEM. In other embodiments, a seal, such as an elastomeric ring, may be incorporated into a test fixture to seal as the end of the SEM column is contacts the fixture.

Several variations of a system are now described. The examples are chosen to show how the concepts related to creating a localized seal allowing inspection of IC circuitry may be employed with a variety of innovative elements. Not all the innovative elements are employed in each of the illustrated examples.

Figure 9:
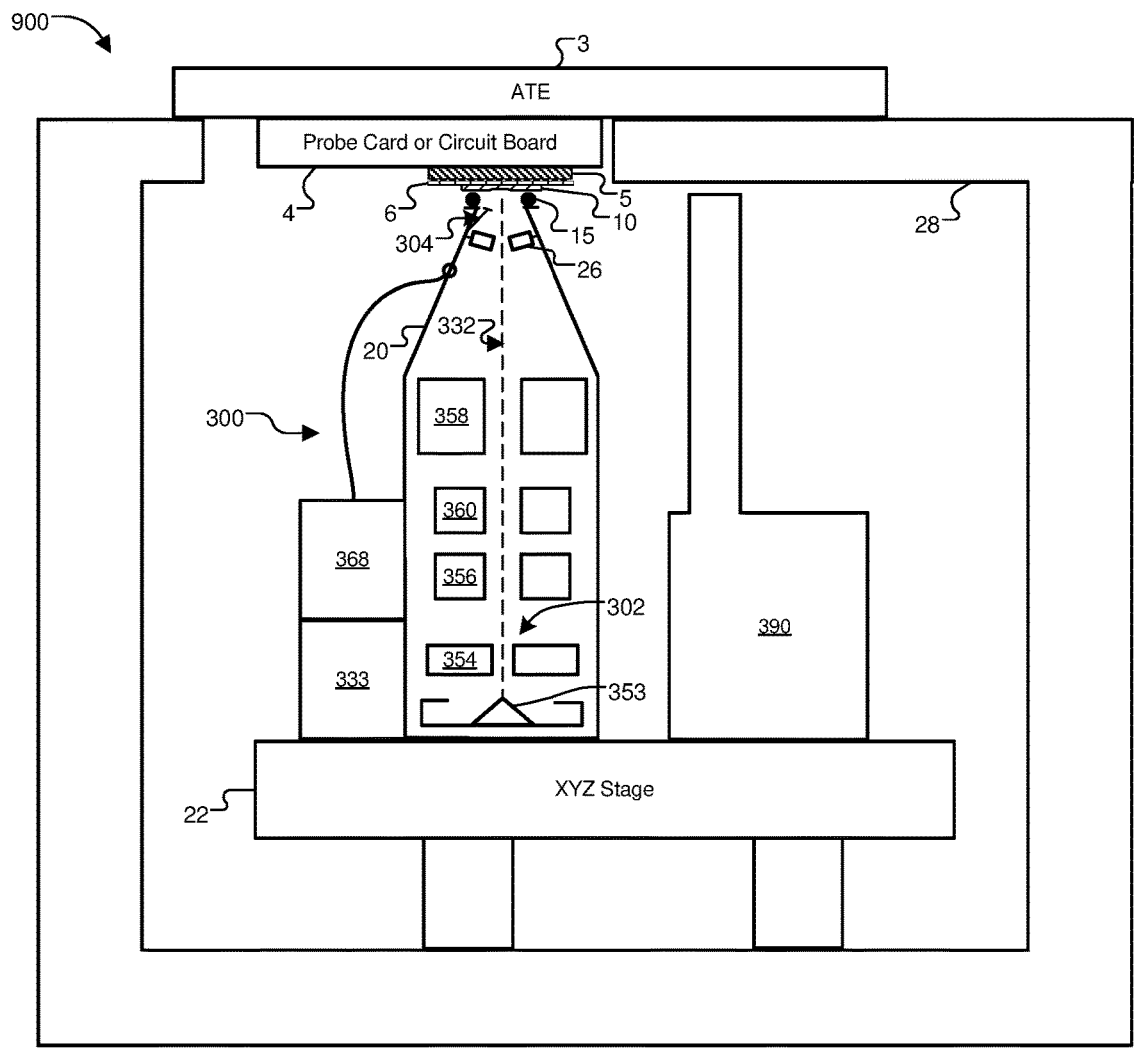
FIG. 9 is a cross section diagram of an example diagnostic system embodying some of the principles herein.

FIG. 1 is a flowchart of a process for examining and diagnosing ICs according to some embodiments. FIG. 9 is a cross section diagram of an example diagnostic system embodying some of the principles herein. The coupling of an ESEM chamber directly to a DUT solves the problem of enabling e-beam probing of the DUT while it is being exercised in its normal test state, such as on an ATE tester, or within a system such as a circuit board. An ESEM or a low-vacuum SEM work in a relatively poor vacuum environment, so a simple O-ring sealing element to the DUT is sufficient to maintain ESEM operation while the DUT is in its normal operating environment.

Referring now to FIG. 1 and sometimes to the system diagram of FIG. 9 and other figures, an example process or method of examining an IC DUT begins at process block 102 where the IC is prepared for examination. For an unpackaged IC, this may involve mounting on a carrier substrate such as a package plate at block 104, this block is optional in some cases because a bare IC or a full die may also be examined using probe cards and a suitable probe head or socket.

Figure 2:
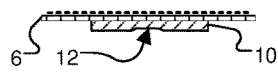
FIG. 2 is a cross section diagram showing an IC thinned at a target area.
Figure 3A:
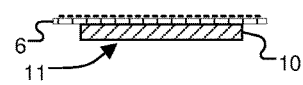
FIGS. 3A and 3B are a sequence of cross section diagrams showing an IC thinned across its entire back-side surface.
Figure 3B:

Next at (optional) block 106, the process thins the IC back-side to the desired depth for examination, at least over a target area but possibly over the entire IC back-side. The thinning process is well known in the art and may be accomplished by any suitable technique. Several techniques are explained, for example, in U.S. Pat. No. 6,872,581 to Shaw, et al., and can be selected based on the application and based on whether the entire IC chip is to be thinned, or only a portion. Mechanical milling and polishing may be used. Other thinning techniques can be applied as well, such as global substrate removal by wet or dry chemical etching, or by local substrate removal by laser chemical etching, by femtosecond laser ablation, by focused ion beam, or by RIE (reactive ion etching), to name several examples. FIG. 2 shows an example in which only a portion of an IC 10 is thinned, at a target area 12 on the back-side of the IC. This IC is mounted in a flip-chip fashion on a carrier substrate or package plate, which faces the terminal circuit elements on the front side of the IC, and electrically connects them to the solder balls on the opposite side of carrier plate 6. Multiple selected target areas can also be thinned, or the entire IC 10 can be thinned, such as shown in the cross section of FIG. 3A where the un-thinned IC 10 is shown mounted to carrier substrate 6, and thinned across its back side 11 to produce the thinned IC 10' in FIG. 3B. In some embodiments, the thinned IC 10' may be thinned down to the depth necessary to expose the circuit elements desired to be examined, such as the STI (shallow-trench interconnect) layer, or in other embodiments a thin layer of silicon may be left remaining over the circuit elements desired to be examined. Generally, as used below "IC 10" (see FIG. 2A to FIG. 7B and FIG. 9) refers to the thinned IC thinned according to any variation of technique. In the most preferred methods, a very thin layer may be left, such as less than 50 nanometers thick from circuit elements closest to an IC back surface in the target area. Preferably any layer remaining would have a thickness of a single micron or less, such as 500 nm, for example, but the techniques herein may also be employed with known processes that leave a thicker layer, such as 2 or 3 microns. Further, different substrate materials can require different remaining thickness, depending on the type of measurements desired and the resulting electromagnetic coupling between the outer surface 11 and certain circuit elements. A fully packed, unpackaged, or partially packaged IC may be thinned at this step.

Figure 4A:
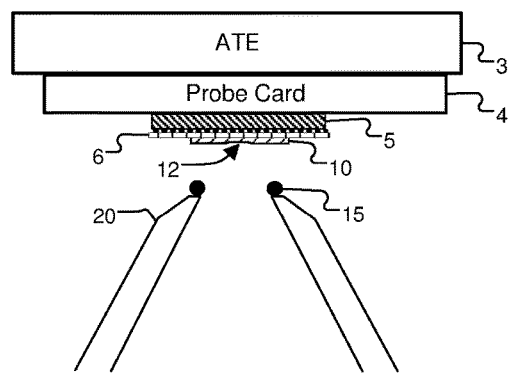
FIG. 4A to FIG. 5B are a sequence of cross section diagrams showing relative movement of a SEM column to create a seal against an unpackaged IC back-side.
Figure 4B:
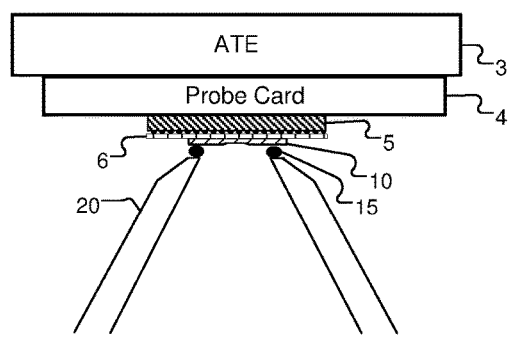
Figure 6A:
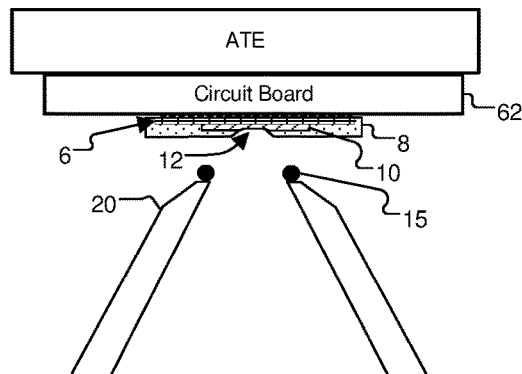
FIG. 6A to FIG. 7B are a similar sequence of cross section diagrams showing relative movement of a SEM column to create a seal against a packaged IC back-side.
Figure 6B:
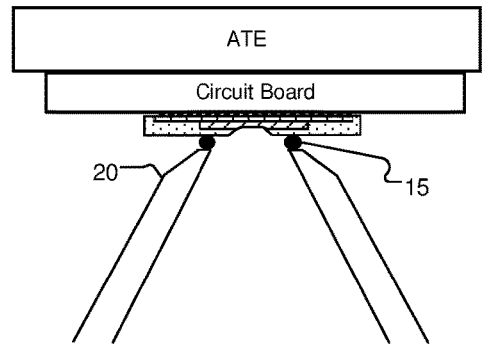

Next at (optional) block 108 of FIG. 1, the process places or mounts the IC 10 in a test fixture. This may include placing in a test socket of a probe card, or mounting to a circuit board using the solder bumps its carrier substrate. This step is shown as optional because some devices under test may be provided already mounted to a host system or suitable testing circuit board, and the process may be conducted on any suitable circuit board should the DUT be accessible. Another advantage of the techniques herein is that they allow evaluation in many cases with the IC 10 mounted to a host system in operational conditions. Generally, the process includes mounting IC 10 if it is not already mounted to a circuit board or other circuit module such as a multi-chip module. In the example of FIGS. 4A and 4B, the test fixture includes automated test equipment (ATE) 3 connected to a probe card 4, having a connector 5, which may be a probe head, socket adapter, or other suitable adapter depending on whether the IC under test is packaged, mounted on a carrier, or bare, and the type of terminals used with the IC. The test fixture is constructed in the manner needed for electrically connecting to the carrier substrate external electrical terminals such as solder balls, solder bumps, or pins. In the example of FIGS. 6A and 6B, the test fixture includes a test circuit board, to which a thinned packaged IC 10 is mounted typically by soldering. These examples will be further described below.

Next the process at block 110 moves the test fixture into place in the test system, moving it into a range of movement and operation. An example of such a position is depicted, for example, in the system diagram of FIG. 9 showing the ATE 3 with its attached probe card 4 and connector 5 in place above the SEM 20 within its operating range. By operating range is meant an area in which the SEM is enabled to scan by moving the SEM relative to the IC. The test system of FIG. 9 will be further described below.

A sealing element 15 is provided at block 112, positioned between the SEM column opening and the IC back-side. Sealing element 15 is typically a deformable seal of some type such as an O-ring or gasket made of any suitable deformable material known, such as rubber, plastics, or composites. The sealing element 15 may be positioned as described in a number of ways, such as attaching it to the SEM column 20 opening at the distal side, supporting it in place between the SEM column 20 and the IC 10 with another support structure, or attaching it to the IC 10 back-side. In a preferred version, the sealing element is already fixed at the SEM column distal end, and remains there between operations. With the sealing element 15 in place, the process next at block 114 moves the SEM column relative to the IC 10 into a position near the target area at the IC back-side such that the sealing element 15 contacts the IC 10, or its packaging material or carrier substrate, thereby creating a seal between the SEM column 20 opening and the IC 10 back-side, the seal surrounding the target area. Preferably the movement is far enough to compress the sealing element between the opposing surfaces of the SEM column 20 and the IC back-side to create a strong seal. Examples of the relative movement at block 114 can be seen in FIG. 4A to FIG. 7B. The movement may be controlled by determining the position of the SEM column 20, or by measuring pressure of the sealing element against the IC, for example, to create a desired sealing pressure. While compressing an O-ring style sealing element is preferred, other methods and means of sealing may be used for one or both sides of the sealed area (the SEM column and the IC back-side), for example adhesives may hold the sealing element to one or both sides. A sealing foam or filler may be used to attach the sealing element to one or both sides, or to form a sealing element entirely.

Figure 5A:
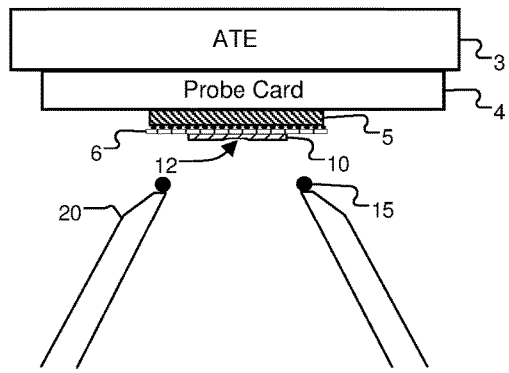
Figure 5B:
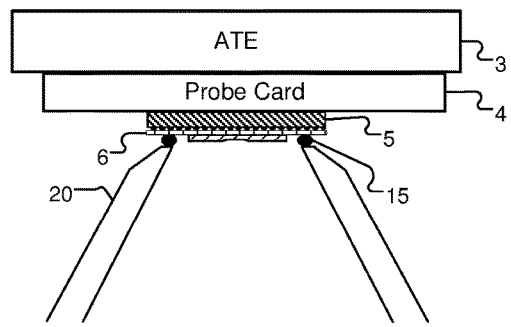

FIGS. 4A and 4B are cross section diagrams showing a sequence of SEM column 20 movement to create a seal against an IC back-side of a bare (unpackaged) and thinned IC 10 that is mounted to a carrier substrate, such as a carrier substrate 6. The mounted IC 10 is connected to probe card 4 with a connector 5 such as a socket or probe socket. Sealing element 15 is positioned between the distal end of the SEM column 20 and the IC 10, surrounding the column opening. Preferably the sealing element is mounted to the SEM column 20 distal end around the opening, but other means such as fittings, clamps, may hold the sealing element in place, or it may be constructed with an elastic sleeve allowing it to be placed over the column opening. FIG. 4A shows the relative positions after process block 112, while FIG. 4B shows the relative positions after the movement of process block 114. Creating the seal may include moving SEM column 20 toward IC 10 to compress sealing element 15 against the IC 10 back-side. Moving the SEM column 20 relative to IC 10 is preferably performed by moving a motion stage 22 on which the SEM column 20 is mounted (FIG. 9). As can be seen, sealing element 15 includes a central opening with which sealing element 15 forms an opening between the SEM column and the target area. This seal allows operation of the SEM in partial vacuum conditions without the requirement of placing the entire test fixture into a SEM vacuum chamber. The process may also be used with an unmounted IC, however electrical connection to the test gear is a more exacting process in such cases FIGS. 5A and 5B show a similar arrangement, but instead of sealing directly against the IC itself, the seal is made against the IC's carrier substrate 6. Because IC 10 is typically smaller in area than the carrier substrate 6, such a seal can be made effectively to surround IC 10 with a sealed environment for SEM examination.

Figure 7A:
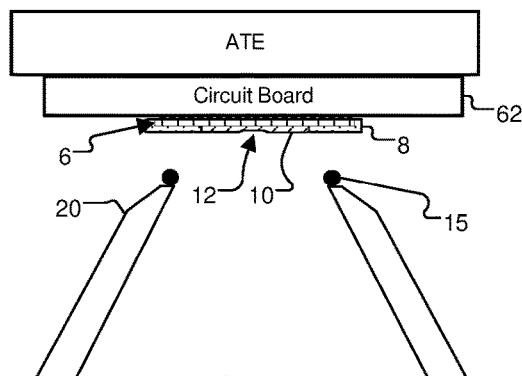
Figure 7B:
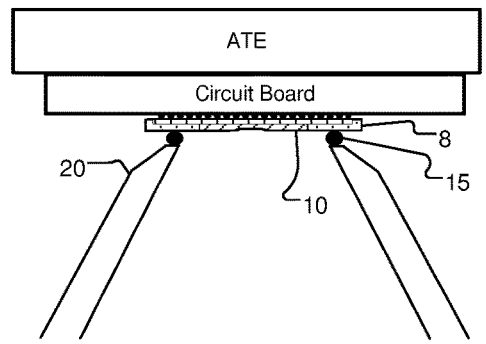

FIGS. 6A and 6B are another example sequence of cross section diagrams showing relative movement of a SEM column 20 to create a seal against a packaged IC 10 back-side. In this embodiment of the process, the IC under test is packaged including the silicon IC chip 10 itself, the carrier substrate 6, solder balls or bumps on the carrier substrate used to mount and electrically connect the IC to the test circuit board 62, and a package body 8 which may be plastic or any other known IC packaging material. The position after the relative movement of process block 114 is shown in FIGS. 7A and 7B, with the sealing element 15 compressed between the SEM column 20 distal end, and the packaged IC back-side. As depicted in this version, IC 10 is thinned only at a target area 12, with the thinning process removing both package body material and IC material to reach the desired depth. Several other processes may be used with a packaged IC. The package body 8 may be completely removed from the IC 10 back-side. Following this, the entire IC back-side may be thinned, or one or more desired target areas may be thinned individually. The relative movement may therefore form a seal against a bare IC chip back side, or a package back side as seen in FIGS. 7A and 7B. It may form a seal against an un-thinned portion, a thinned portion thinned to a different depth than the target area, or form a seal against thinned area surrounding the target area and thinned to the same depth as the target area (as would be the case, for example, when the entire IC 10 back-side surface is thinned). The area against which the seal is formed is preferably flat, but this is not limiting and various types of sealing elements may allow for roughness or other variations in the IC surface under sealing element 15 and still achieve a suitable seal. Further, while the example methods described here form a seal against a surface of the IC (for example, the thinned silicon IC chip itself, the carrier substrate, or the packaging filler), this not limiting and other embodiments may embed a sealing element into one or more of such surfaces, such as by milling a narrow trench into which a narrow sealing element may be pressed or fixed with adhesive.

Figure 8A:
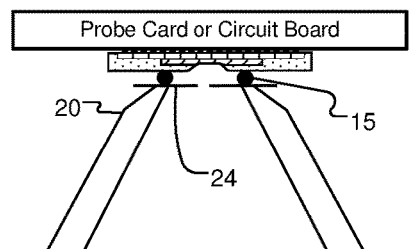
FIG. 8A to FIG. 8E are cross sectional diagrams showing variations of structures that may be used at the SEM column distal end to hold or engage a sealing element, and or adjust the size of a column opening that may be too large for a particular IC to be examined.

Referring again to FIG. 1, with the seal created, the process next goes to block 116 where it operates a vacuum pump to create at least a partial vacuum in a sealed volume between the SEM column 20 opening and the IC 10 back-side surface. The pump employed may be the same pump used to evacuate the SEM column, or another pump may be provided with a vacuum port in the SEM toward the distal end to allow improved vacuum quality. Preferably, the vacuum is as strong as possible to allow for highest quality SEM sensitivity and resolution. The vacuum quality may be limited by pumping time constraints or by the quality of seal formed at block 114. In some versions, the at least partial vacuum has a vacuum level down to 1 kPa. Using an environmental SEM (ESEM) or a low-vacuum SEM (LVSEM) as SEM 300 allows operation at lower vacuum qualities (i.e., higher pressures) in this context, as further discussed below. As shown in FIG. 8A, for example, the SEM may include a pressure limiting aperture 24 between the volume of the SEM column 20 and the sealed volume surrounding the target area 12. Other versions may have no pressure limiting aperture, in which case the sealed volume created is in common with the vacuum inside the SEM column 20.

With the seal created and the vacuum formed in the volume between the SEM distal end and the target area, the process goes to process block 118, where it begins examining the IC by applying a voltage to a circuit element of the IC 10, the voltage inducing an electrical potential in the target area. Next at block 120, the process detects the electrical potential as a surface feature of the target area using the SEM. Blocks 118 and 120 may include applying constant electrical signals, or time varying electrical signals to create operating test conditions for circuits in the IC, according to any suitable techniques known in the art. Some versions of the process include applying multiple time varying voltage signals to selected IC circuit elements to create test conditions in the IC, the signals inducing at least one time varying electrical potential in the target area, and then detecting the time varying electrical potential(s) as surface features of the target area using the SEM. In prior techniques, generally to perform such testing required the IC 10 to be placed in a vacuum chamber in which the SEM operates, and all the electrical signals required for testing were required to be connected through pass-throughs into the vacuum chamber or created inside the vacuum chamber. The techniques herein allow the test signals to be connected to the IC outside of the SEM operating vacuum, and greatly simplify the process of creating operational test conditions for testing an IC by allowing many tens or hundreds of signals to be connected to the IC to create the desired test conditions.

Detecting the electrical potential at block 120 may include a number of variations. In some versions, it includes obtaining a surface voltage contrast image by detecting the electrical potential of multiple features along the target area. The method may include using the voltage contrast image for locating a circuit element in the IC, or using the voltage contrast image for detecting a fault in a circuit element in the IC. The use of an SEM to detect voltages at an IC back-side may be combined with the techniques herein to improve the test process and test setup. For example, as discussed in the background herein, techniques are known which measure voltage signals at exposed circuit elements or circuit elements beneath a thin layer of silicon remaining after the IC has been thinned to a desired depth. Any of these techniques may be improved by use of the various embodiments of the invention.

Figure 10:
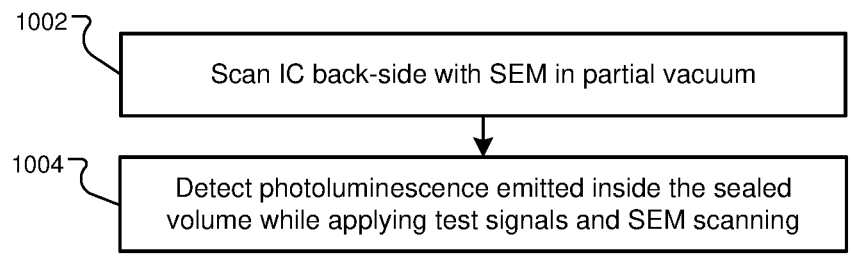
FIG. 10 shows a partial flowchart illustrating a variation of the IC examination process in which luminescence is also detected.

FIG. 10 shows a partial flowchart illustrating a variation of the IC examination process in which luminescence is also detected. This technique may use a photon detector positioned near or at the SEM column 20 opening, such as photon detector 26 shown in FIG. 9. The use of such a detector allows cathodoluminescence or photoluminescence to be combined with the SEM measurements herein. At process block 1002, the process scans the IC back-side with the SEM, which may be a separate scan or the same scans discussed with regard to FIG. 1. While doing so, the process at block 1004 detects photons emitted from the IC inside the sealed volume while scanning the SEM. This provides further data that may especially help in navigating to a desired location amongst all the circuitry present in and around the target area. This block may include locating a desired target circuit and pointing the SEM for measurement at that circuit.

Referring now in more detail to FIG. 9, a cross section is shown in diagram form (not to scale), depicting an example diagnostic system embodying some of the principles herein. Generally, a system 900 is shown for examining an IC DUT, and may include multiple examination tools in addition to the depicted SEM 300, including tools traditionally used for electrical failure analysis (EFA) of ICs. For example, an SEM as taught herein may be installed in an Optical Fault Isolation (OFI) system, such as the Meridian system by Thermo Fisher Scientific, and the system programmed according to the methods herein.

Depicted is system 900 for examining at least one IC device under test held in a test fixture, such as the IC 10 shown. The test fixture in this version includes ATE 3 connected to a probe card 4, having a connector 5 for connecting to IC 10, which may be a probe head, socket adapter, or other suitable adapter depending on whether the IC under test is packaged, mounted on a carrier, or bare, and the type of terminals used with the IC. In some cases, a socket connector with probes may be used to connect to a bare IC with no package plate, the probes connecting to terminals formed in the surface traces of the IC front side. The test fixture is constructed in the manner needed for electrically connecting to the IC terminals directly or indirectly through the carrier substrate external electrical terminals such as solder balls, solder bumps, or pins. The test fixture connector 5 includes multiple electrical connections for coupling multiple high speed electrical signals to and from the IC, the electrical connections coupled to the IC outside of the sealed volume as described below. The number of high-speed varying voltage signals coupled into the IC may be in the hundreds for certain advanced controller ICs. A test circuit board may be used for the test fixture instead, as shown in the example of FIGS. 6A and 6B, to which a thinned packaged IC 10 is mounted on a footprint typically by soldering.

An SEM 300 including an electron source 302, a focusing column 20 having a distal end with an opening for emitting an electron beam 332 toward a target area, and an electron detector 304, is positioned to detect electrons from the target area. The SEM 300 in this version can be a standard SEM, an environmental SEM (ESEM), a low-vacuum SEM column, or any other suitable SEM.

In this version, electron detector 304 is shown mounted just inside the opening of column 20 with a direct path to all of the desired target area, however in other versions it may be present on an outer face of the column distal opening (inside of sealing element 15), or mounted in the space of the opening itself, positioned facing in the distal direction toward IC 10 and inside of the sealing element 15 so as to detect electrons from the target area of IC 10. A photon detector 26 is also positioned near or at the SEM column 20 distal opening, and may be placed on the distal face of the column opening (again, inside of sealing element 15), or mounted near the beam path close to the opening. In this version, the photon detector generally has a ring shape, which may be partially obscured by the electron detector 304, but other versions may use other suitable shapes such as a segmented ring from which a segment is removed to allow placement of an electron detector, for example. The use of such a detector allows luminescence to be measured from the IC 10 when the beam is active. It is noted that the detectors 304 and 26 are items typically mounted outside an SEM column in a vacuum chamber or environmental chamber, however in this case the sealing element 15 acts to create a very small vacuum environment outside the column, leaving little space outside the column to place detectors. The sealing element 15 is adapted to be positioned as shown at the distal end of the SEM column with the sealing element's central opening alighted with the column opening to allow electrons to pass through the central opening.

The electron beam 332 is emitted from a cathode or other electron source 353 by applying voltage between cathode 353 and an anode 354. Electron beam 332 is focused to a fine spot by means of a condensing lens 356 and an objective lens 358. Electron beam 332 is scanned two-dimensionally on the specimen by means of a deflection coil 360. A system controller 333 controls the operations of the various parts of SEM system 300. The SEM column 20 is evacuated under control of controller 333 with vacuum pump 368, shown with a vacuum conduit connected to the SEM column 20, which in this version creates the vacuum both inside the SEM column 20 and in the sealed area outside the distal end of column 20 inside sealing element 15. In other versions, a column adapter element may provide a slightly larger volume of vacuum outside of the SEM column itself between the SEM column and the sealing element 15.

System 900 also includes one or more mounting structures holding the SEM and the test fixture. The one of more mounting structures provide relative motion between the SEM and the test fixture. At least one of the mounting structures is adjustable to a first inactive position in which the test fixture holds the IC spaced apart from the sealing element and SEM column, and a second operational position in which the test fixture holds the IC with the back-side of the IC placed against the sealing element to form a seal between the IC back-side and the SEM column distal end, creating a sealed volume which can be evacuated to at least a partial vacuum. The sealed volume may extend from the back-side of the IC to a pressure limiting aperture in the SEM column. The back-side of the IC, with a target area for inspection, forms a part of the enclosure of the sealed volume. In the depicted example, the mounting structures are the X, Y, Z stage 22 and a rack or frame 28 designed to hold the ATE 3 in place, and allow it to be disconnected or swiveled out of the frame 28 for attaching a new DUT. The SEM 300 is mounted to the XYZ stage, allowing the movement described herein for forming the seal against the IC, and for moving SEM 300 way from IC 10 away to allow other tools to examine the IC. Note that while the examination tools are arranged to be moved in this version, this is not limiting and other embodiments may conduct the relative movement of the SEM column 20 and IC 10 by moving the test fixture. For example, stage 22 could be a X,Y,Z movement-capable rotary stage holding multiple examination tools. Optionally, one or more additional examination tools 390 as shown also mounted to X,Y,Z stage 22. These tools 390 may include a near-infrared microscope, a laser-assisted device alteration (LADA) device, a visible light probe, a visible light microscope, or a photon emission microscope (PEM), for example.

The system controller 333 is shown only in block diagram form, but may be embodied as separate controllers for different tools, and a separate controller controlling the movement of the mounting structures such as the X,Y,Z stage 22. Typically, a PC will be operably connected or networked to each controller to provide the system user interface. It should be understood that system controller 333 or a connected control PC includes software necessary to execute the automated portions of the methods herein through being operatively connected to the SEM. For example, system controller 333 is programmed to control the SEM to scan the target area to analyze the circuit. For example, the SEM may scan the target area to detect the electrical potential at the surface of the target area by observing the emission of secondary electrons on a thinned target area on the back-side of the IC. Such imaging is referred to as voltage contrast imaging. Any circuit analysis or test that using an SEM can be performed, including, for example, EBIC, RCE, EBAC, EBIV, or EBIRCH.

FIG. 8A to FIG. 8E are cross sectional diagrams showing variations of structures that may be used at the SEM column distal end to hold or engage a sealing element, and or adjust the size of a column opening that may be too large for a particular IC to be examined. These example structures may be employed with any of the variations of thinning situations discussed herein (packaged and unpackaged, partially thinned or entirely thinned, etc.). As shown in FIG. 8A, a SEM column 20 has a distal opening which may include a pressure limiting aperture 24 (PLA), limiting the amount of air or gas that can enter the column opening to improve the SEM results. A sealing element 15 is paced around the opening against the outer side of the pressure limiting aperture 24. If a strong, rigid aperture is used, the sealing element 15 may be smaller than the radius of the column 20 end opening, and the sealing element could be placed around the central aperture of PLA 24 to reduce the size of the sealed area. It is noted that a pressure limiting aperture would increase the time needed to pump down to a desired vacuum level to create a vacuum in the sealed volume between column 20 and IC 10, since the pump is typically connected in the column 20 to provide a vacuum in the column 20. A PLA may also be positioned higher up within the SEM column, away from the end.

Figure 8B:
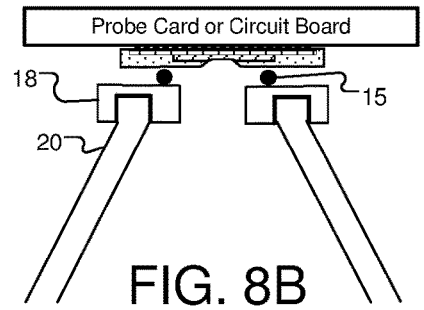
Figure 8C:
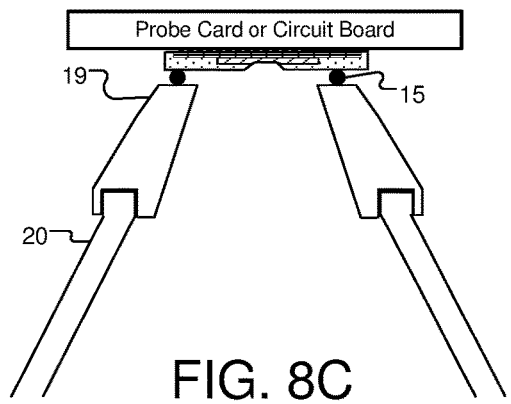

FIG. 8B shows a cross section diagram of a SEM column opening having a column adapter element 18 mounted at the column 20 opening to narrow the column opening. Such a structure may be used to adapt the column opening to seal against a chip or desired area much smaller than the actual opening size. For example, a column adapter element may reduce the opening size from an original size of 10 mm to 5 mm, 3 mm, 2 mm, or a diameter of less than 2 mm. Adapter 18 may be made of rigid material such as metal or a rigid plastic in order to apply pressure from the column 20 distal end to the seal without substantially bending. The adapter is made to be fitted over or attached to the column 20 distal end, and such attachment should be airtight to allow a vacuum to be formed. FIG. 8C shows another example of a column adapter element 19, in this case extending the column 20 length as well as narrowing the opening size. A column adapter element may be adapted to hold the sealing element in a way that simplifies removing the sealing element, so that the sealing element is removable and interchangeable. For example, a fitting or trench may be formed at the distal surface of an adapter element to hold the sealing element 15. A column adapter element may also form a heat spreader for placement against the IC back-side to dissipate heat while the IC is operated for examination. The adapter element may hold a heat spreader such as a diamond heat spreader against the IC back-side, either inside the sealing element radius, outside the sealing element radius, or both.

Figure 8D:
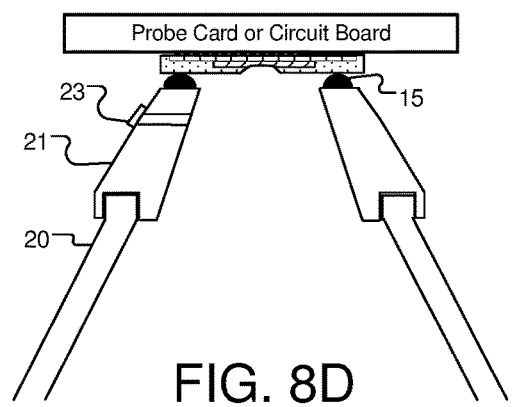

FIG. 8D is a cross section diagram showing a similar column adapter element 21, in this case having a sealing element 15 bonded to the distal end surface of the column adapter element 21. A vacuum line attachment port 23 allows an additional vacuum line to be attached near the sealing element to speed the formation of a vacuum after the seal is created, and improve the vacuum quality near the target area when the beam is in operation, since any leaks in the vacuum will be around the edges of sealing element 15.

It is noted that a similar vacuum port may be provided close to the SEM column 20 distal end, preferably within a few mm distance.

Figure 8E:
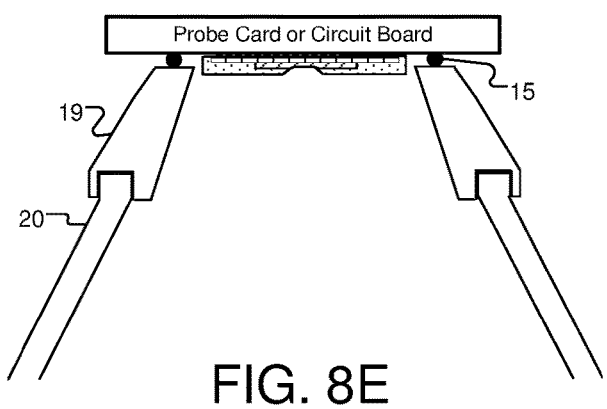

FIG. 8E is a cross section diagram of another variation in which the sealing element 15 is placed against a surface of the test fixture immediately surrounding the IC 10. This may be done whether the test fixture uses a probe card or a circuit board or other suitable structure. Preferably in such cases the seal is placed close to the IC 10 to minimize the volume required to be evacuated. In some embodiments, the test fixture may have a receiving structure such as a trench or coating present along the surface to maximize the quality of the seal, the sealing element 15 being placed against the receiving structure. These techniques may also be employed without a column adapter element, with the sealing element 15 placed directly between the test fixture and the SEM column 20 distal end.

Figure 11:
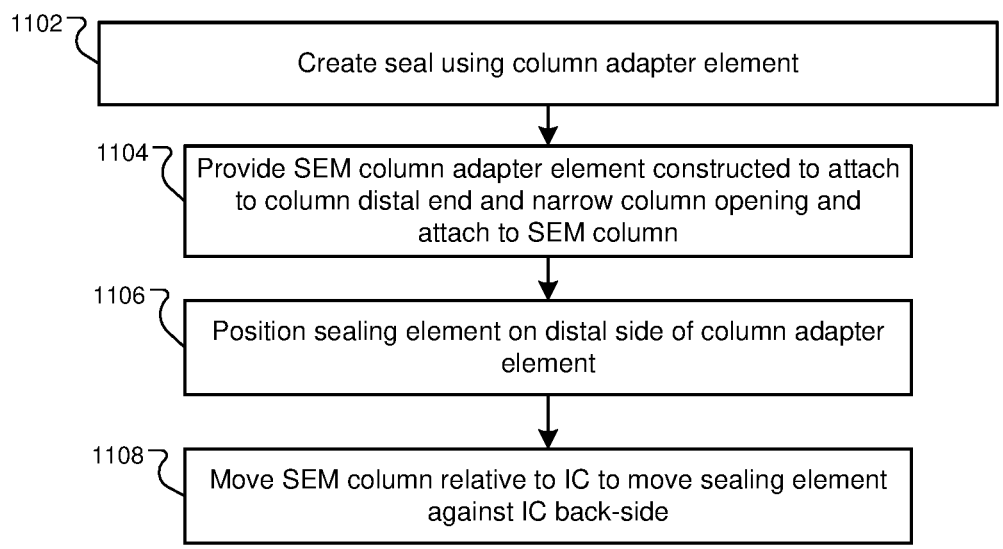
FIG. 11 is a flowchart of an example method of creating a localized seal using a SEM column adapter element.

FIG. 11 is a flowchart of an example method of creating a localized seal using a SEM column adapter element. This provides an example technique which may be used, for a number of alternative embodiments, at process blocks 112 and 114 of FIG. 1. The process of creating the seal at block 1102 starts with providing an SEM column adapter element, such as those elements in FIG. 8A to FIG. 8E, constructed to attach to column distal end. The element may be constructed to narrow the column opening, or may not significantly narrow the opening. Some column adapter elements may provide a structure for sealing against the IC that is larger than the column opening diameter, for example. Attaching the adapter to the column distal end may involve screwing it onto matching threads machined on the column end, welding or otherwise bonding it, or other suitable airtight and rigid attachment methods. Next at block 1106 the process positions a sealing element at the distal side of the column adapter element. The sealing element may take any of the forms and methods described herein or a variety of alternative forms. The use of a column attachment element provides much greater freedom in designing the size, shape, and attachment method of the element for implementations in which the construction of the SEM column 20 is fixed, or column 20 was not specifically designed for the application desired. With the sealing element between the column adapter element distal end and the IC, the process then moves the SEM column relative to the IC to place the sealing element against the IC back-side, similarly to the method of FIG. 1, creating a seal with compression or another suitable technique as described herein. The process then continues with creating an at least partial vacuum in the localized volume within the seal as described above.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. The invention has broad applicability and can provide many benefits as described and shown in the examples above. The embodiments will vary greatly depending upon the specific application, and not every embodiment will provide all of the benefits and meet all of the objectives that are achievable by the invention.

It should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated ICs programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a non-transitory storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of non-transitory computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

The terms "work piece," "sample," "substrate," and "specimen" are used interchangeably in this application unless otherwise indicated. Further, whenever the terms "automatic," "automated," or similar terms are used herein, those terms will be understood to include manual initiation of the automatic or automated process or step.

In the following discussion and in the claims, the terms "including" and "comprising" are used in an open-ended fashion, and thus should be interpreted to mean "including, but not limited to . . . ." To the extent that any term is not specially defined in this specification, the intent is that the term is to be given its plain and ordinary meaning. The accompanying drawings are intended to aid in understanding the present invention and, unless otherwise indicated, are not drawn to scale.

The various features described herein may be used in any functional combination or sub-combination, and not merely those combinations described in the embodiments herein. As such, this disclosure should be interpreted as providing written description of any such combination or sub-combination.

Although the present invention and its advantages have been described in detail, it should be understood that various changes, substitutions and alterations can be made to the embodiments described herein without departing from the scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method of examining an integrated circuit (IC) using a scanning electron microscope (SEM) having an SEM column with an SEM column opening at one end from which an electron beam is emitted, the method comprising:
    sealing the SEM column opening around a target area on a back side of the IC to create a sealed volume at the SEM column opening, the target area forming a part of an enclosure of the sealed volume;
    evacuating the sealed volume;
    applying a voltage to a circuit element of the IC, the voltage inducing an electrical potential in the target area; and
    scanning the electron beam over the target area to detect the electrical potential at the surface of the target area.

2. The method of claim 1 in which sealing the SEM column opening around the target area comprises sealing, using a sealing element, the SEM column opening against the IC from the back side or against an IC holder holding the IC.

3. The method of claim 2 in which sealing the SEM column opening around the target area comprises causing relative motion between the SEM column and the IC to compress the sealing element against the IC or against the IC holder.

4. The method of claim 3 in which causing relative motion between the SEM column and the IC comprises moving the SEM toward the IC.

5. The method of claim 1, further comprising:
    thinning the IC at least at the target area from the back side of the IC such that the distance of the circuit element in the target area closest to a surface of the thinned IC on the back side is less than 1 micron; and
    placing the IC in a test fixture if the IC is not already mounted in a circuit module that serves as the test fixture.

6. The method of claim 1 in which evacuating the sealed volume comprises evacuating a space between the IC and a pressure limiting aperture in the SEM column.

7. The method of claim 1 in which evacuating the sealed volume comprises evacuating the sealed volume to a pressure of between 10 Pa and 25 kPa.

8. The method of claim 1 further comprising detecting photons emitted from the IC within the sealed volume while scanning the SEM.

9. The method of claim 1 in which the SEM column comprises an environmental SEM (ESEM) column or other low-vacuum SEM column.

10. The method of claim 1 in which scanning the electron beam over the target area comprises scanning the electron beam over the target area with the IC mounted in an IC holder and further comprising examining the IC in the IC holder with a near-infra red microscope.

11. The method of claim 1 in which scanning the electron beam over the target area to detect the electrical potential at the surface of the target area comprises detecting secondary electrons emitted from the target area in response to an incident electron beam.

12. The method of claim 11 in which detecting secondary electrons emitted from the target area in response to the incident electron beam comprises forming a voltage contrast image of the target area.

13. The method of claim 1 in which scanning the electron beam over the target area to detect the electrical potential at the surface of the target area comprises sensing a change in a signal from the IC through a test fixture connection as the electron beam scans the target area.

14. The method of claim 1 in which scanning the electron beam over the target area comprises scanning the electron beam over the target area using the SEM column having a column adapter element mounted at the SEM column opening to narrow the SEM column opening to a diameter of less than 2 mm.

15. The method of claim 14 in which sealing the SEM column opening around the target area on the back side of the IC comprises sealing the SEM column opening around the target area on the back side of the IC using a sealing element positioned on a distal side of the column adapter element.

16. An apparatus for examining a target area on the back side of an IC comprising:
    a test fixture including multiple electrical probes to connect to multiple contacts on the IC;
    an SEM including an electron source, an SEM focusing column having a distal end from which an electron beam is emitted toward the target area, and an electron detector positioned to detect electrons emitted from the target area in response to the incident electron beam;
    a sealing element adapted to be positioned at the distal end of the SEM focusing column and having a central opening to allow electrons to pass;
    a moveable mount holding the SEM or the IC and configured to cause relative motion between the SEM and the IC to cause the sealing element to form a seal between the SEM focusing column and the IC or the test fixture, the seal around the target area; and
    a vacuum pump coupled to the SEM focusing column and operable to create a partial vacuum between the IC and the distal end of the SEM focusing column.

17. The apparatus of claim 16, further comprising a controller operatively connected to the SEM, and programmed to control the SEM to perform voltage contrast imaging on the target area.

18. The apparatus of claim 16, in which the test fixture includes multiple electrical connections for coupling multiple high speed electrical signals to and from the IC, the electrical connections coupled to the IC outside of the partial vacuum.

19. The apparatus of claim 16, further comprising a photon detector mounted to the SEM focusing column at a location such that, with the apparatus in an operational position, the photon detector is inside the partial vacuum.

20. The apparatus of claim 16, further comprising at least one additional inspection tool held by the moveable mount, said moveable mount further adjustable to move a selected one of the at least one additional inspection tool relative to the IC to a third operating position to observe the IC, wherein the selected additional inspection tool is one of a near-infrared microscope, a laser-assisted device alteration (LADA) device, a visible light probe, a visible light microscope, or a photon emission microscope (PEM).

21. The apparatus of claim 16, in which the sealing element is a deformable gasket and in which creating the seal includes moving the SEM focusing column toward the IC to compress the sealing element against the IC from a back side of the IC.

\* \* \* \* \*